US006441620B1

(12) United States Patent
Scanlan et al.

(10) Patent No.: US 6,441,620 B1
(45) Date of Patent: Aug. 27, 2002

(54) METHOD FOR FAULT IDENTIFICATION IN A PLASMA PROCESS

(76) Inventors: John Scanlan, 50 Summerville Ave., Waterford; Justin Lawler, Maoillrea, Dungriffen, Howth, County Dublin; Stephen Daniels, 24 Killeen Crescent, Malahide, County Dublin, all of (IE)

( * ) Notice: Subject to any disclaimer, the term of this patent is extended or adjusted under 35 U.S.C. 154(b) by 20 days.

(21) Appl. No.: 09/650,277

(22) Filed: Aug. 29, 2000

(30) Foreign Application Priority Data

Jun. 20, 2000 (IE) .......................................... S2000/0497

(51) Int. Cl.[7] .............................................. G01N 27/66
(52) U.S. Cl. .................... 324/459; 324/464; 315/111.21
(58) Field of Search ................ 324/709, 705, 324/459, 464, 76.21; 315/111.21, 111.51, 111.61, 111.71

(56) References Cited

U.S. PATENT DOCUMENTS

| 5,308,414 A | * | 5/1994 | O'Neill et al. ................. 216/60 |
| 5,314,603 A | | 5/1994 | Sugiyama et al. |
| 5,458,732 A | | 10/1995 | Butler et al. |
| 5,472,561 A | | 12/1995 | Williams et al. |
| 5,534,108 A | * | 7/1996 | Qian et al. ..................... 216/68 |
| 5,576,629 A | * | 11/1996 | Turner et al. ................ 324/709 |
| 5,808,415 A | | 9/1998 | Hopkins |
| 5,866,985 A | | 2/1999 | Coultas et al. |
| 5,910,011 A | | 6/1999 | Cruse |
| 5,939,886 A | | 8/1999 | Turner et al. |
| 6,061,006 A | | 5/2000 | Hopkins |
| 6,252,354 B1 | * | 6/2001 | Collins et al. .......... 315/111.51 |

* cited by examiner

Primary Examiner—N. Le
Assistant Examiner—Vincent Q. Nguyen
(74) Attorney, Agent, or Firm—Thomas M. Freiburger

(57) ABSTRACT

A method of fault identification in a plasma process powered by an RF source comprises initially determining, in respect of a given baseline plasma process, the changes in magnitude of a plurality of Fourier components of the RF source resulting from changes in a plurality of the process input parameters from their baseline values. These magnitude changes are stored as reference data. During a subsequent production run, the plasma process is monitored for faults and if one is found the baseline process is repeated with input parameter values nominally the same as the original baseline values. The changes in the Fourier components from the original baseline values are determined and compared with the reference data to determine which input parameter(s) have changed.

8 Claims, 5 Drawing Sheets

Change of current fundamental with process pressure

Change of 3$^{rd}$ harmonic of current with process pressure

METHOD FOR FAULT IDENTIFICATION IN A PLASMA PROCESS

BACKGROUND AND SUMMARY OF THE INVENTION

The present invention relates to a method of fault identification in a plasma processing reactor powered by an RF source.

Many thin film processes use plasma processes to facilitate the rapid and accurate fabrication of minute structures with desired properties. Plasma processes include the deposition and etching of metal, conductors and semiconductors on a substrate, for example, a silicon wafer. The plasma process usually involves placing the substrate in a vacuum chamber, introducing process gases and applying radio-frequency (RF) power, typically 0.1 to 100 MHz, to create a plasma. The plasma consists of ions, electrons, radical gas species and neutral gas, all of which permit the desired reaction to proceed. The plasma reaction has many inputs, including RF power, gas flows, chamber pressure, substrate and wall temperatures, chamber wall conditions, electrode spacing and so on.

Control of the complex plasma process is the key to improved manufacturing, i.e. to have accurate and repeatable processing the plasma itself should be repeatable. Unfortunately there are few schemes in existence for direct plasma monitoring and control. It is more usual to monitor or control gas flow, power output from RF generator, chamber pressure or temperature, etc., i.e. the process parameters or process inputs. However, since the plasma process depends directly on the plasma parameters, measuring these indirect variables is generally not sufficient. The plasma represents a non-linear complex load in electrical terms. This results-in the generation of harmonics of the RF driving signal. These harmonics, known as Fourier components, are very sensitive to changes both in the plasma process and the process parameters.

It is generally accepted that monitoring the Fourier components of the RF power signal provides a useful way to monitor the plasma process. These components are a more direct measurement of the plasma process since they are more directly related to fundamental plasma parameters.

It is known to use an RF sensor to monitor and control RF plasmas by measuring the Fourier components of voltage and current. The sensor can be used in closed or open loop control, as for example, in etch end-point control or as in-situ monitoring of the plasma process. In either case the plasma can be terminated when one or more of the RF Fourier components reaches predetermined limits.

Unfortunately, when problems occur in the plasma reactor due to undesired changes in input parameters, such as changes in gas flow rate, the RF sensor as previously described can only determine that a fault has occurred, i.e., it cannot determine which input parameter(s) have changed.

There is therefore a need for a method which overcomes the limitations of present fault detection schemes on plasma reactors.

Accordingly, the present invention provides a method of fault identification in a plasma process powered by an RF source, comprising the steps of:

(a) determining, in respect of a given baseline plasma process, the changes in magnitude of a plurality of Fourier components of the RF source resulting from changes in a plurality of the process input parameters from their baseline values, (b) storing said magnitude changes as reference data, (c) running the plasma process during a subsequent production run, (d) during said production run, determining if there is a fault in the plasma process, (e) if there is a fault, repeating the baseline process with input parameter values nominally the same as the baseline values of step (a), (f) determining the magnitudes of the said Fourier components in respect of the repeat baseline process, and (g) comparing the data determined at step (f) with the reference data to determine which input parameter(s) have changed.

In the present specification a baseline plasma process is a plasma process with pre-determined values for the process input parameters.

The invention provides a technique which allows an operator to diagnose the cause of a fault, or at least eliminate a large number of probable causes, which would otherwise prove costly to investigate.

DESCRIPTION OF THE DRAWINGS

An embodiment of the invention will now be described, by way of example, with reference to the accompanying drawings, in which.

DESCRIPTION OF PREFERRED EMBODIMENTS

Figure 1:
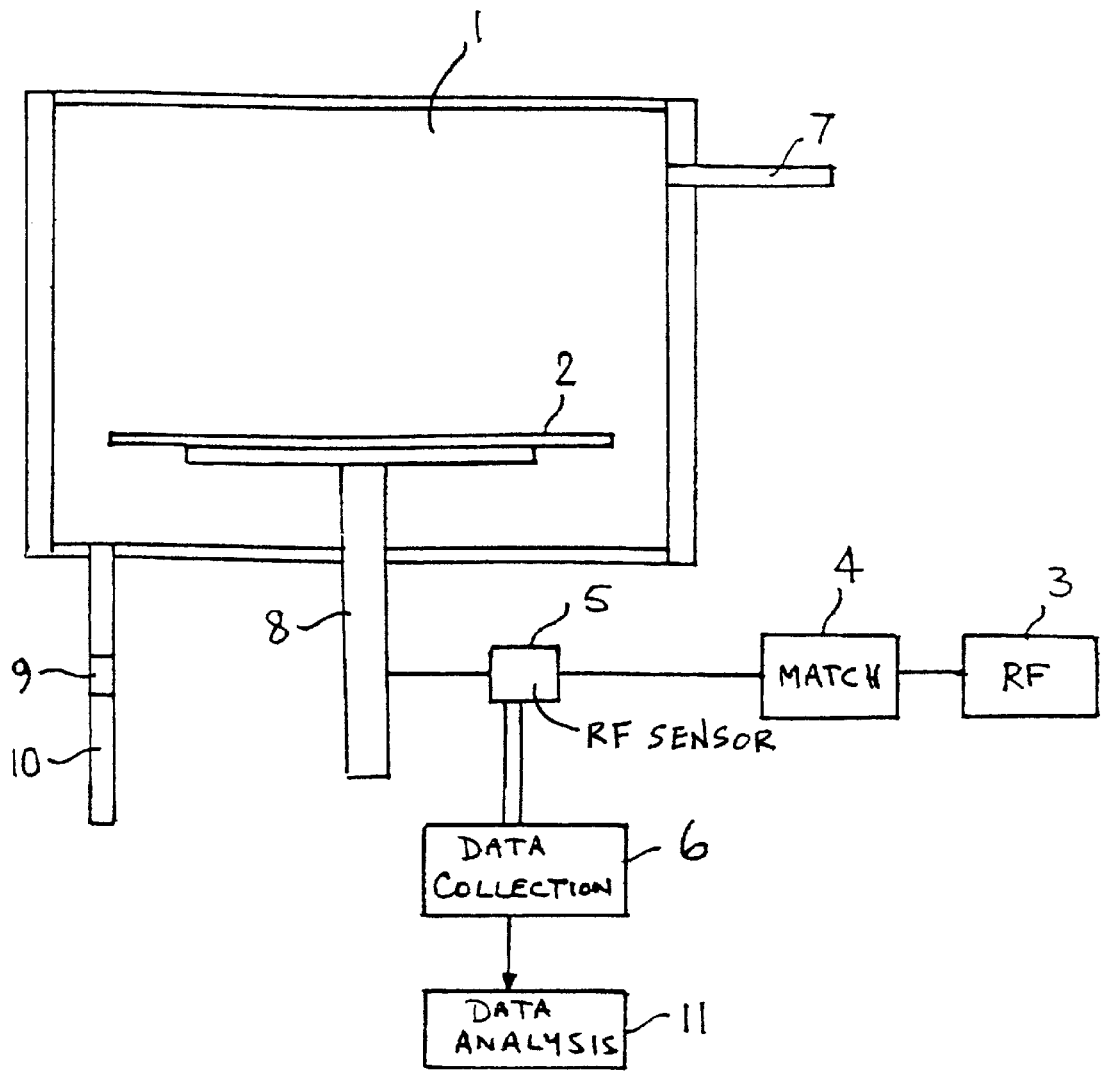
FIG. 1 depicts a typical plasma process chamber.

FIG. 1 shows a typical plasma process reactor. It includes a plasma chamber 1 containing a wafer or substrate 2 to be processed. A plasma is established and maintained within the chamber by an RF power source 3. This source generally has real impedance which must undergo a transformation to match that of the complex plasma load. This is done via match network 4. Power is coupled to the plasma chamber, typically by capacitive coupling, through an electrode 8. Process gases are admitted through gas inlet 7 and the chamber is maintained at a desirable pressure by pumping through gas exhaust line 10. A throttle valve 9 may be used to control pressure. The plasma permits effective manufacture of for example, semiconductor devices, by changing gas chemistry. Gases such as C12, used to etch silicon and metal, for example, are converted into reactive and ionized species. Etching of the very fine geometry used to fabricate semiconductor devices is made possible by the reactive gases, ions and electrons of the plasma.

The wafer is processed according to some recipe, which is controlled by the tool operator. This recipe includes input parameter settings such as process gas flow rates, chamber pressure, substrate/wall temperatures, RF power settings on one or more power generators, recipe time, inter-electrode spacing, etc. This is the case for all plasma processing tools, such as etch, deposition, etc. The wafer will undergo very many plasma process steps before completion. Each step contributes to the overall product yield; a fault at any one step may destroy potential product.

Referring again to FIG. 1, an RF sensor 5 is used to measure the voltage and current of the RF electrical power signal in the complex post-match electrical line. A Fourier Transform is performed in data collection electronics 6 using a sampling technique which extracts the Fourier components of the voltage and current and the phase angle between these vectors. This data sampling should have sufficiently high resolution to determine Fourier components (in this embodiment the first five including the fundamental) across a very large dynamic range (90dB) with phase resolution of up to 0.001 degree. Suitable techniques for high resolution sampling and measurement of Fourier components are described in U.S. Pat. 5,808,415.

Figure 2:
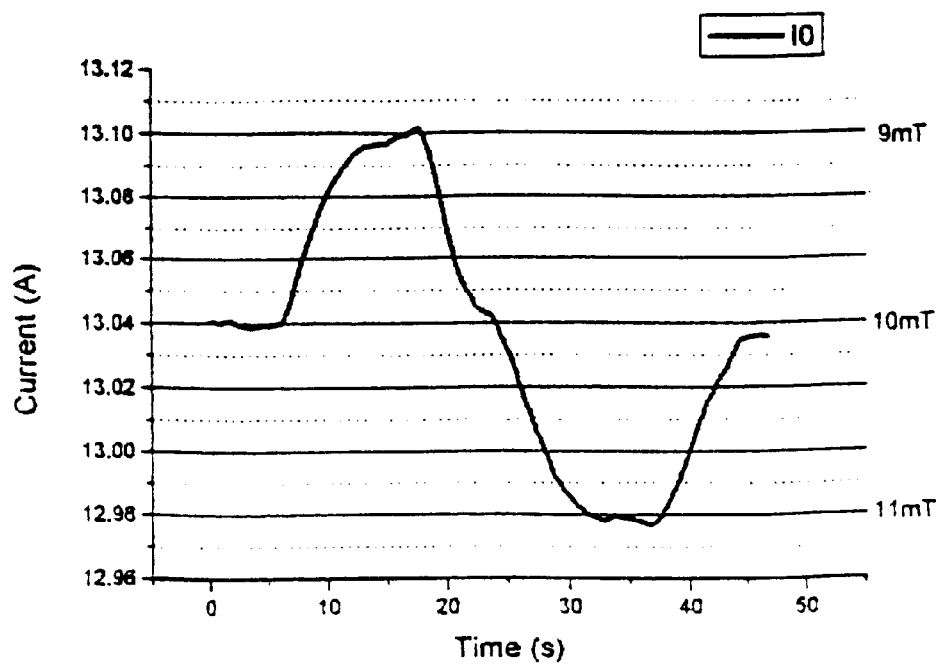
FIG. 2 shows the response of an RF sensor to changes in process pressure.
Figure 2:
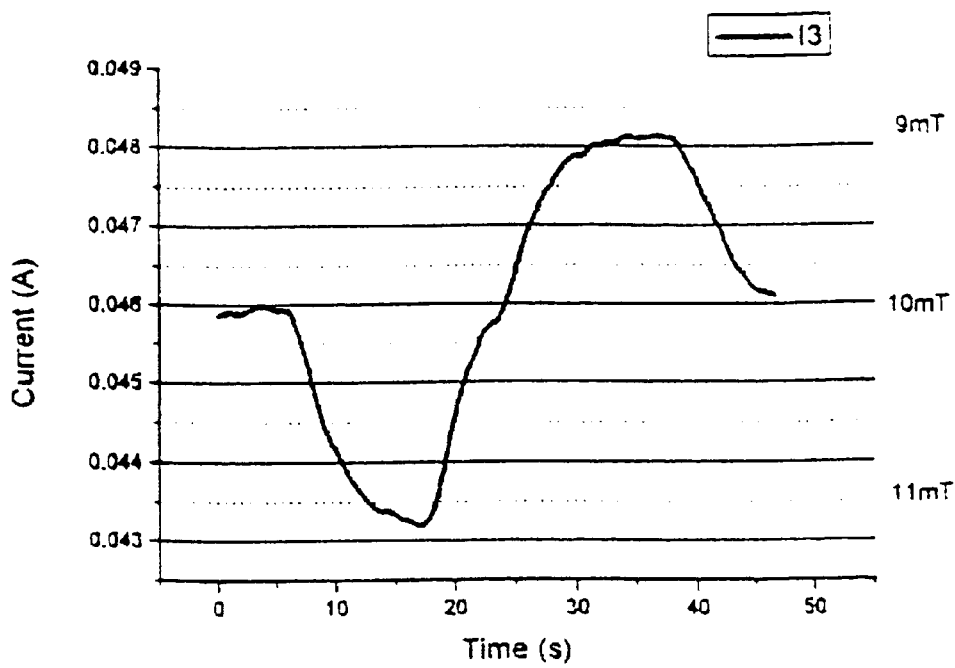

These Fourier components are very sensitive to plasma events. For example, FIG. 2 shows the variation in the plasma current fundamental and 3rd harmonic with process pressure change. These signals are typical, and all 15 Fourier components (voltage, current and phase each at the fundamental and first four harmonics) respond to changes in input parameters such as pressure, gas flow, power, etc., in a similar manner.

The wafer fabrication process involves running entire batches of wafers with similar plasma process recipes to ensure reliable volume production. If the plasma process on each wafer is the same, then the measured Fourier components will reflect this. Any change in the plasma process will be registered by change(s) in the Fourier components.

Figure 3:
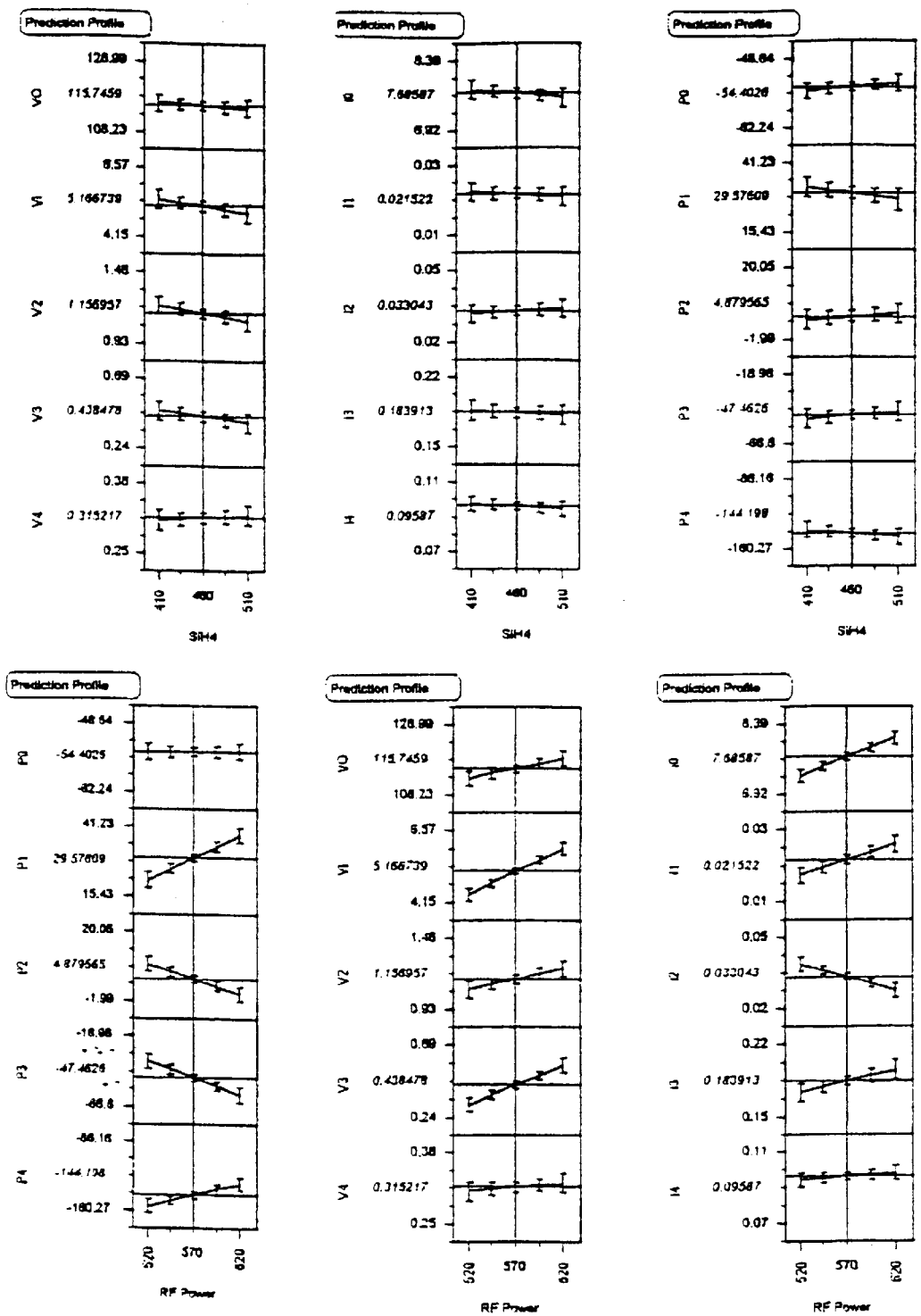
FIG. 3. shows a DOE data set taken with the RF sensor on a plasma reactor.

FIG. 3 shows data derived from a so-called Design of Experiments (DOE) run on a plasma Chemical Vapour Deposition tool. The data is from a 3-level, 5-factor Box-Behnken Surface Response run. The full data from the DOE depicts the predicted changes in magnitude of all 15 Fourier components referred to above as a function of variations in five process input parameters. FIG. 3 shows the data relating to only two of such input variables, SiH4 concentration and RF power. Varying any one of the five process input parameters results in a specific and repeatable pattern of changes in the 15 Fourier components.

Figure 4:
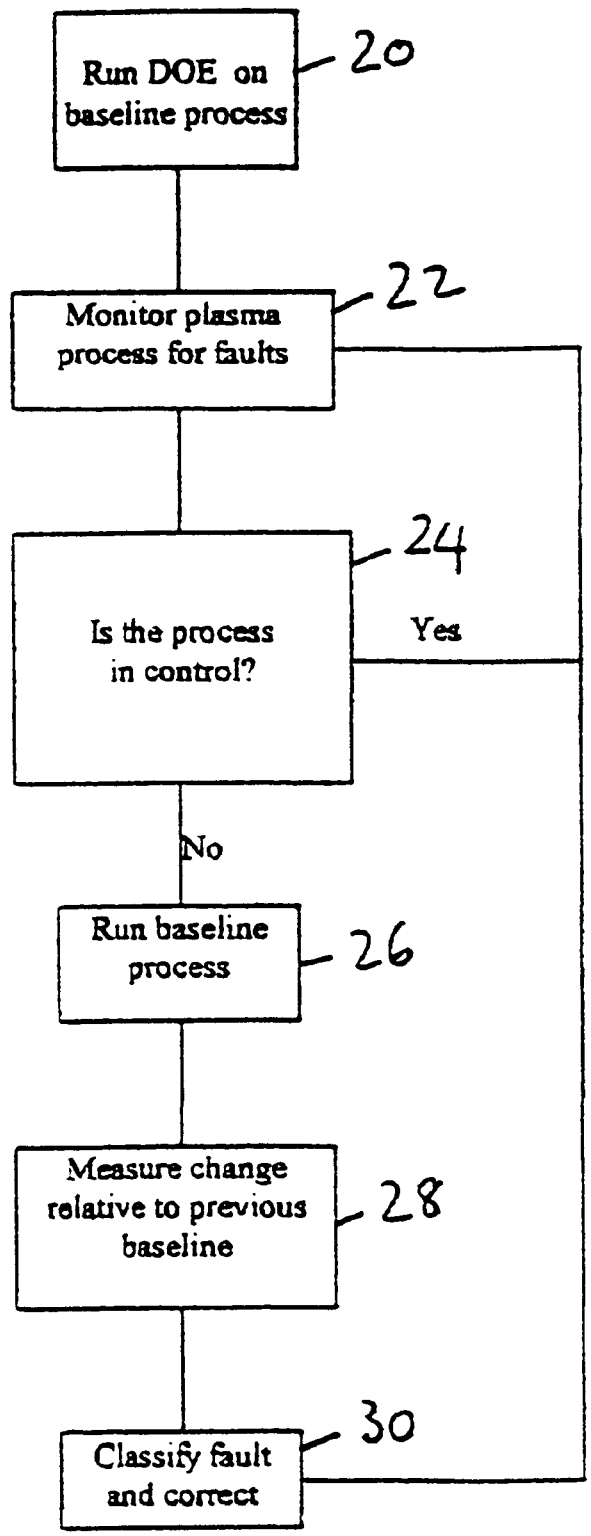
FIG. 4 depicts a flow diagram of the method in accordance with the present embodiment.

In the use of the above technique for identifying faults in a production run, FIG. 4, a DOE is run on a baseline plasma process using a non-product test wafer, step 20. This determines the changes in magnitude of the aforesaid fifteen Fourier components as a function of changes in a plurality of the process input parameters from their baseline values. The baseline values are chosen to represent the values of the process input parameters typically to be used in the production run, and the DOE looks at the range of likely excursions of these variables. The DOE data is stored for reference and can be regarded as a "fingerprint" of the particular plasma process.

Figure 5:
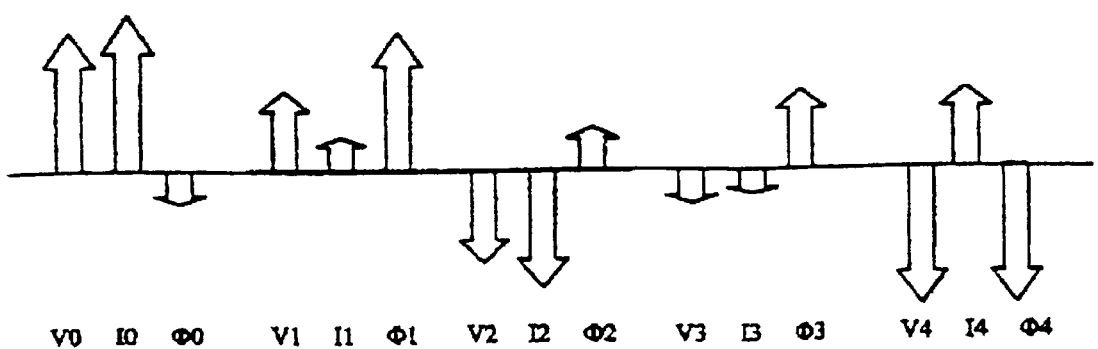
FIG. 5 is a visual representation of changes in Fourier components of a plasma process.

During a subsequent production run, step 22, the plasma process is monitored for faults, step 24. If a fault is detected in the plasma process (for example, using standard SPC methods, final electrical tests, yield data, plasma SPC, MVA techniques, etc.) then the baseline process is run again on the test wafer, step 26, and the changes in the Fourier components relative to their original baseline values are determined, step 28. FIG. 5 is a visual representation of changes in the fifteen Fourier components from the original baseline values resulting from step 28.

Since the second baseline process (step 26) is run with the same nominal values for the process input parameters as the baseline values used for the original DOE (step 20), the changes represented by FIG. 5 can be compared to the stored fngerprint to determine with a reasonable degree of certainty which process input parameter(s) have changed, step 30, and the process can be corrected.

It is to be understood that the changes in the process input parameters which the method is designed to detect are not those such as occur in response to changes in the relevant external input settings; obviously, these can be readily determined. Rather, it is changes which occur despite such input settings remaining nominally unchanged through some fault in the plasma process. For example, the mass flow rate sensor could develop a fault so that the rate of introduction of gas into the chamber varied from the value indicated by the sensor, or the match unit could absorb power so that the delivered RF power was less than that indicated on the power meter associated with the RF source. The comparison with the stored reference data can be performed using standard pattern recognition software 11, FIG. 1. This can use standard statistical software techniques; for example, simple correlation techniques such as regression (least squares) can be used to statistically measure confidence levels on matches with previously stored data. The software may reside on a personal computer, digital signal processor or the like.

The foregoing technique is not limited to process input parameters. Many other faults occur in plasma process chambers. For example, following regular preventative maintenance, a chamber is stripped and cleaned. Parts may or may not be replaced. It is possible to correlate changes in RF components with chamber part lifetime, so that faults in individual parts can be included in the reference data. Furthermore, faults on the substrate itself, due to misprocessing on a previous step can also be included in the technique. In short, the system can be programmed for new failure mechanisms.

It is to be understood that the technique is not limited to the measurement of 15 Fourier components as described. Any number can be used, provided that there is a sufficient number of independent components to adequately classify the plurality of process inputs.

It should also be understood that the method of fault detection (FIG. 4, step 24) is not limited. Any technique can be used. The invention is directed to the identification of faults, not their detection.

It should also be understood that a test wafer may not be necessary. The baseline process may be run on an alternative substrate or with no substrate. Furthermore, it is also possible to baseline the process on a product wafer.

It should also be understood that it is not essential to determine the correlation of RF components with process input parameters using a Design of Experiments. For example, each of the process inputs can be varied independently while all others remain fixed.

It should also be understood that the entire process may or may not be automated in software. The technique as described is performed in step-wise fashion. However, it is possible to automate the entire routine, from collecting correlation data to reporting faults.

It should also be understood that the process is not necessarily limited solely to the use of the RF Fourier components to define the reference data. It may be advantageous to add other independent plasma sensor inputs which may contribute to the data. For example, the ion flux intensity from the plasma provides an independent measure of the plasma process and can be added to improve the technique.

The invention is not limited to the embodiment described herein which may be modified or varied without departing from the scope of the invention.

What is claimed is:

1. A method of fault identification in a plasma process powered by an RF source, comprising the steps of:

(a) determining, in respect of a given baseline plasma process performed in advance of a production run, the changes in magnitude of a plurality of Fourier components of the RF source resulting from known changes in a plurality of the process input parameters from their baseline values, (b) storing said parameter changes and corresponding Fourier component magnitude changes as reference data, (c) running the plasma process during a subsequent production run, (d) during said production run, determining if there is a fault in the plasma process,(e) if there is a fault, repeating the baseline process with input parameter values nominally the same as the baseline values of step (a), (f) determining the magnitudes of the said Fourier components in respect of the repeat baseline process, and (g) comparing the data determined at step (f) with the reference data to determine which input parameter(s) have changed.

2. The method of claim 1, wherein the Fourier components of step (a) are those of the voltage, current and phase of the RF power signal.

3. The method of claim 1, wherein the baseline process is carried out on a test wafer.

4. The method of claim 1, wherein the baseline process is carried out on a product wafer.

5. The method of claim 1, wherein the baseline process is carried out in the absence of a wafer.

6. The method of claim 1, wherein step (g) is performed by statistical techniques.

7. The method of claim 1, further comprising determining the variations in a quantity other than RF power as a function of the variations in the input parameters from the baseline values, and including such variations in the reference data.

8. The method of claim 7, wherein the quantity other than RF power step is ion flux intensity.

* * * * *